US010622264B2

(12) United States Patent
Cheng et al.

(10) Patent No.: US 10,622,264 B2
(45) Date of Patent: Apr. 14, 2020

(54) NANOSHEET DEVICES WITH DIFFERENT TYPES OF WORK FUNCTION METALS

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/423,364

(22) Filed: May 28, 2019

(65) Prior Publication Data

US 2019/0304848 A1 Oct. 3, 2019

Related U.S. Application Data

(62) Division of application No. 15/938,522, filed on Mar. 28, 2018, now Pat. No. 10,388,577.

(51) Int. Cl.
*H01L 21/84* (2006.01)
*H01L 21/3213* (2006.01)
(Continued)

(52) U.S. Cl.
CPC ...... *H01L 21/845* (2013.01); *H01L 21/28114* (2013.01); *H01L 21/32134* (2013.01); *H01L 21/32139* (2013.01); *H01L 27/1211* (2013.01); *H01L 29/0673* (2013.01); *H01L 29/42392* (2013.01); *H01L 29/4958* (2013.01); *H01L 29/4966* (2013.01); *H01L 29/7853* (2013.01)

(58) Field of Classification Search
CPC ............ H01L 21/845; H01L 21/28114; H01L 21/32139; H01L 21/32134; H01L 27/1211; H01L 29/4966; H01L 29/42392; H01L 29/0673; H01L 29/4958; H01L 29/7853
USPC ......................................................... 257/392
See application file for complete search history.

(56) References Cited

U.S. PATENT DOCUMENTS

| | | |
|---|---|---|
| 9,012,319 B1 | 4/2015 | Choi et al. |
| 9,362,355 B1 | 6/2016 | Cheng et al. |

(Continued)

OTHER PUBLICATIONS

List of IBM Patents or Patent Applications Treated as Related; (Appendix P); Date Filed: May 28, 2019, 2 pages.

(Continued)

*Primary Examiner* — Caleen O Sullivan
(74) *Attorney, Agent, or Firm* — Cantor Colburn LLP; Vazken Alexanian

(57) ABSTRACT

A technique relates to a semiconductor device. A first work function metal is in first stack and second stacks, each having nanowires separated by the first work function metal. A mask is on the first stack such that the first work function metal in the first stack is protected while the first work function metal in the second stack is exposed. The mask is undercut by removing a portion of first work function metal in first stack, leaving a gap. A plug is formed in the gap underneath the mask so as to protect the first work function metal in first stack. First work function metal in the second stack is removed, thereby removing the first work function metal from in between the nanowires of the second stack. The mask and plug are removed from first stack. A second work function metal is formed on first and second stacks.

20 Claims, 16 Drawing Sheets

(51) Int. Cl.
  *H01L 21/28*   (2006.01)
  *H01L 27/12*   (2006.01)
  *H01L 29/49*   (2006.01)
  *H01L 29/78*   (2006.01)
  *H01L 29/06*   (2006.01)
  *H01L 29/423*  (2006.01)

(56) References Cited

U.S. PATENT DOCUMENTS

| | | |
|---|---|---|
| 9,482,835 B2 | 11/2016 | Granger et al. |
| 9,620,590 B1 | 4/2017 | Bergendahl et al. |
| 9,653,289 B1 | 5/2017 | Balakrishnan et al. |
| 9,954,058 B1 | 4/2018 | Mochizuki et al. |
| 9,997,519 B1 | 6/2018 | Bao et al. |
| 2017/0069481 A1 | 3/2017 | Doris et al. |

OTHER PUBLICATIONS

Loubet, N. et al., "Stacked nanosheet gate-all-around transistor to enable scaling beyond FinFET." Proc IEEE 2017 Symposium on VLSI Technology, pp. T230-T231 (2017).

Mertens, H. et al., "Vertically stacked gate-all-around Si nanowire CMOS transistors with dual work function metal gates." Proc. IEEE International Electron Devices Meeting (IEDM 2016), pp. 19-7.1 to 19-7.4 (2016).

Kangguo Cheng et al., "Nanosheet Devices With Different Types of Work Function Metals," U.S. Appl. No. 15/938,522, filed Mar. 28, 2018.

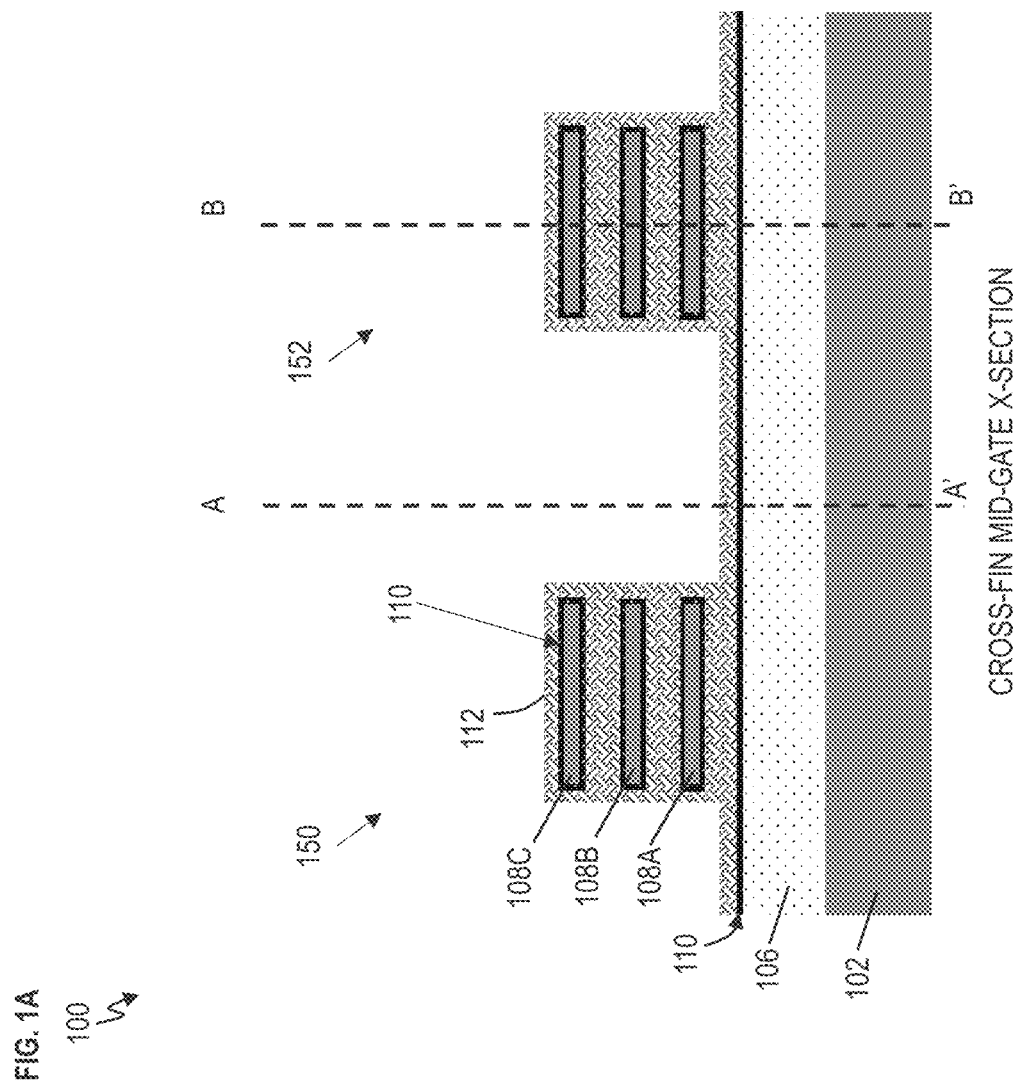

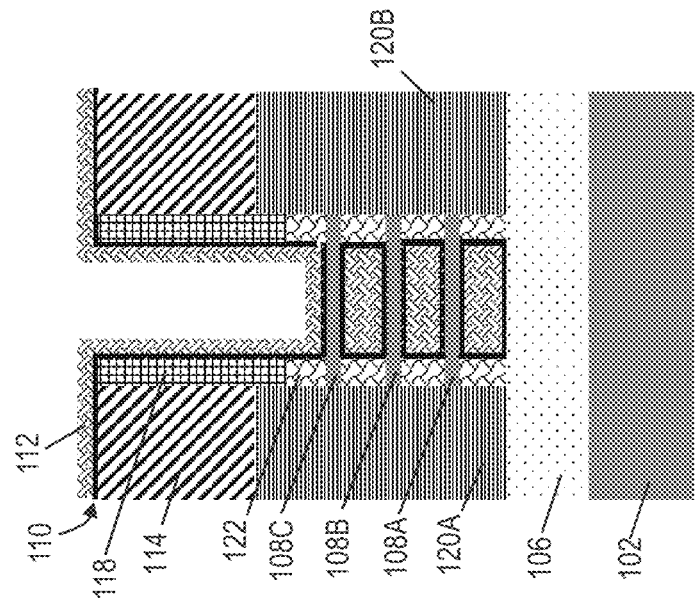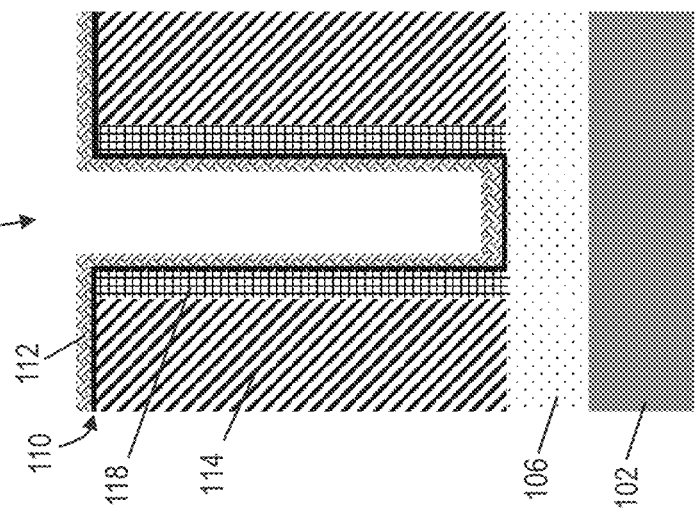

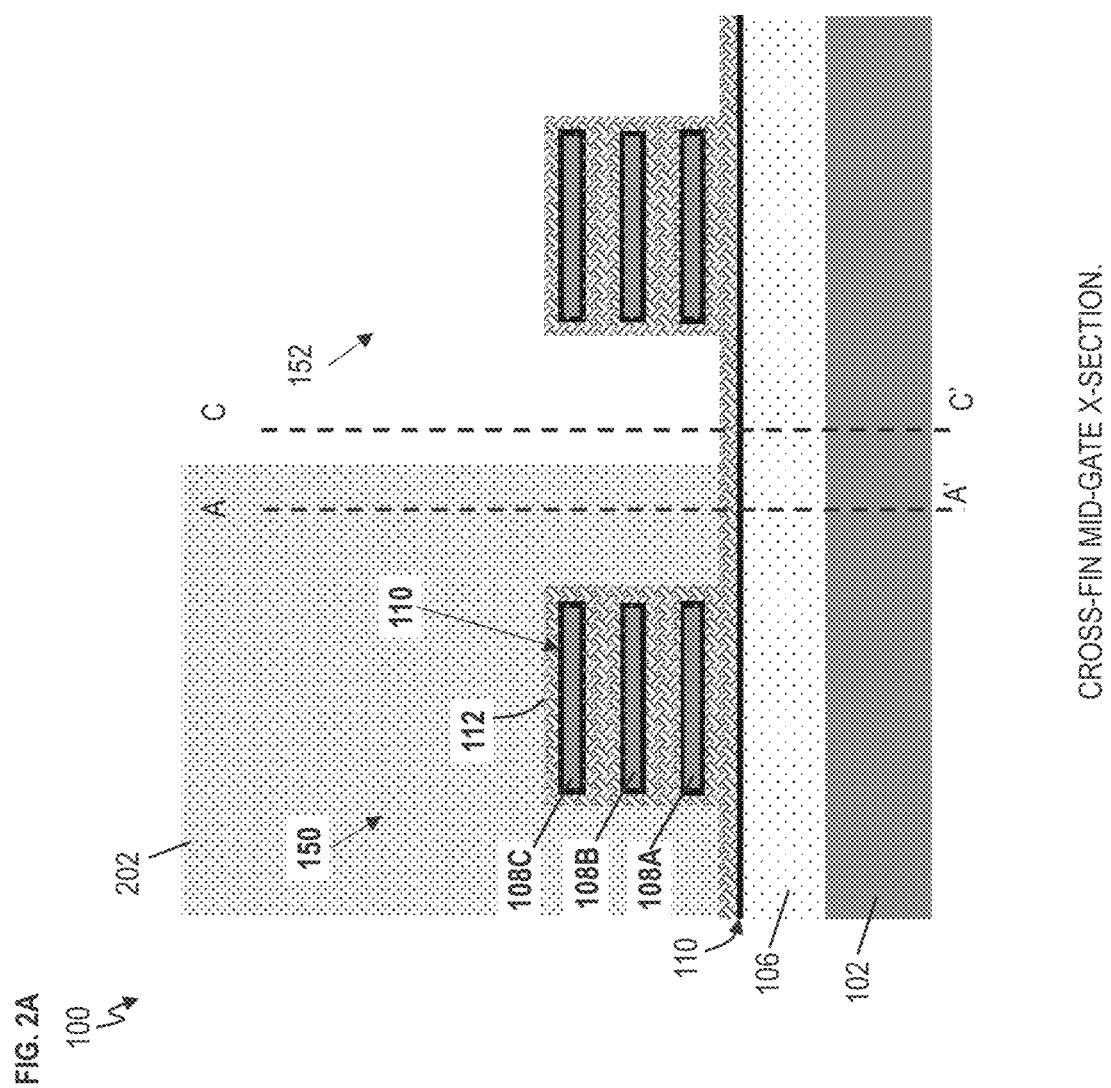

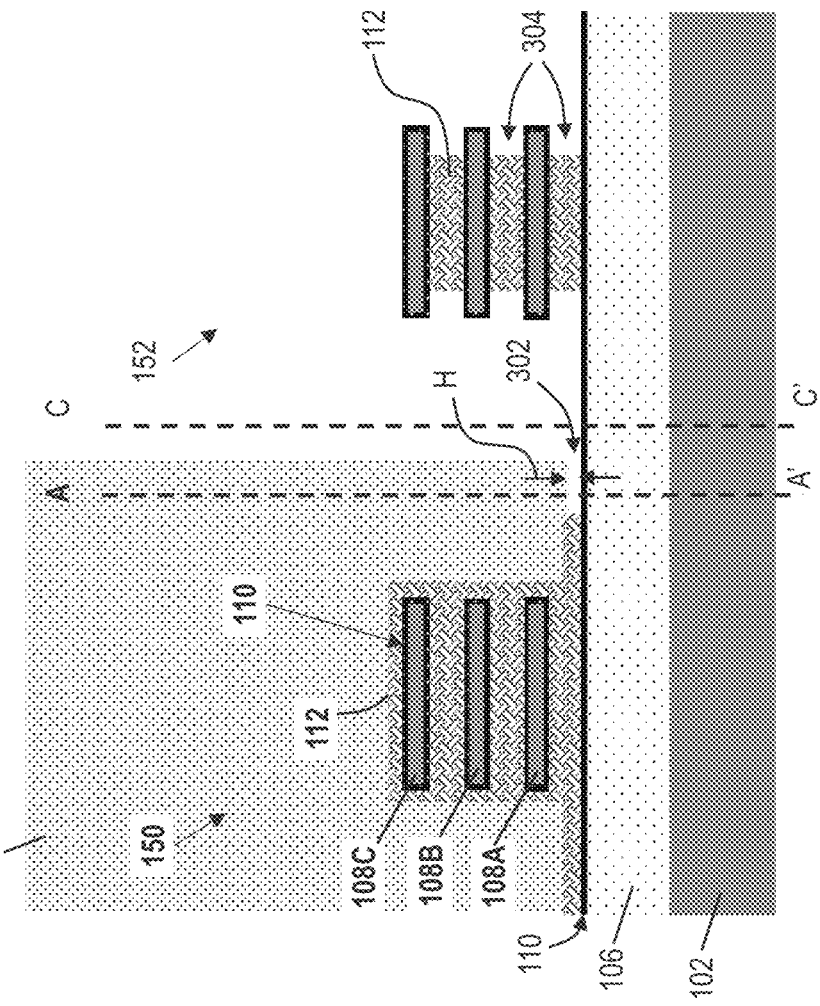

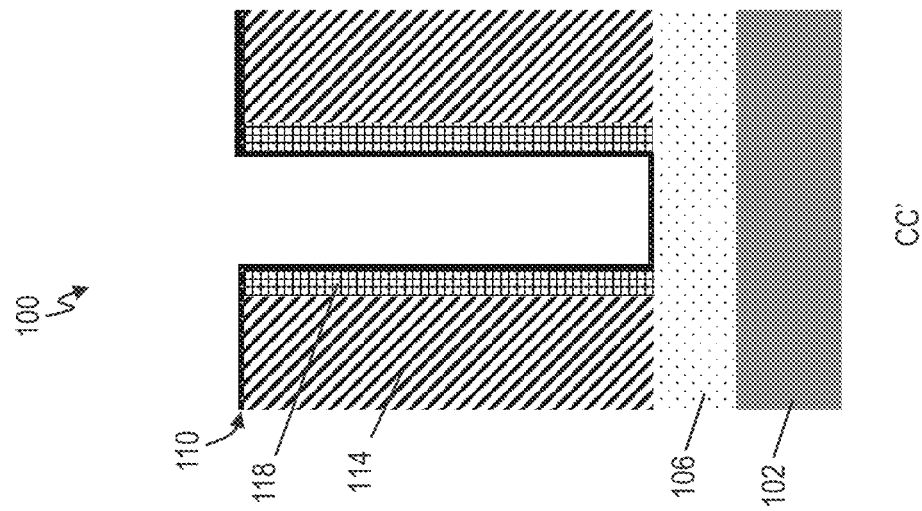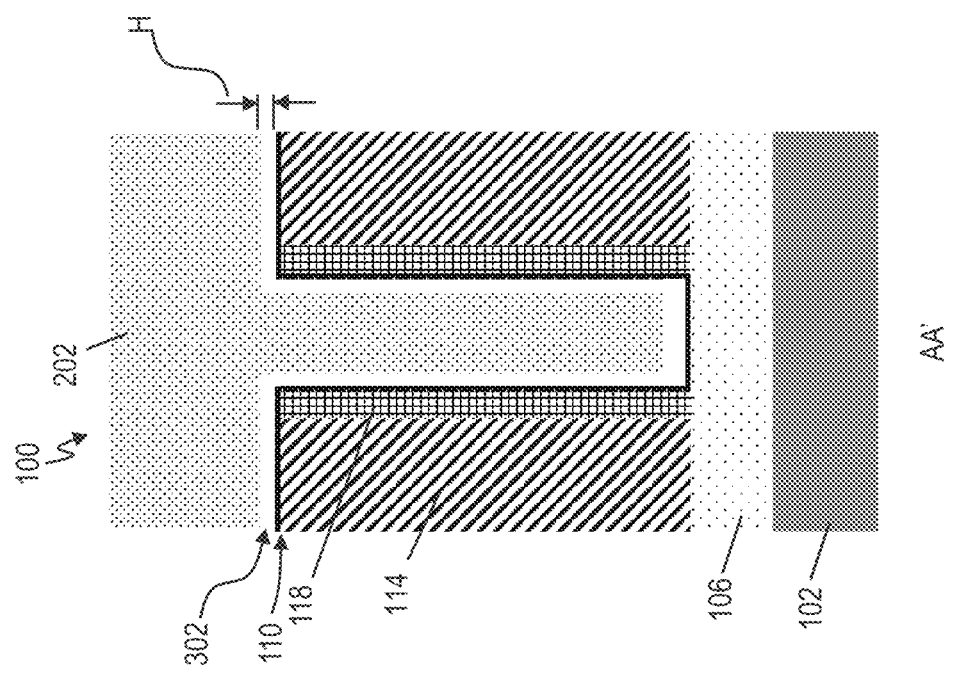

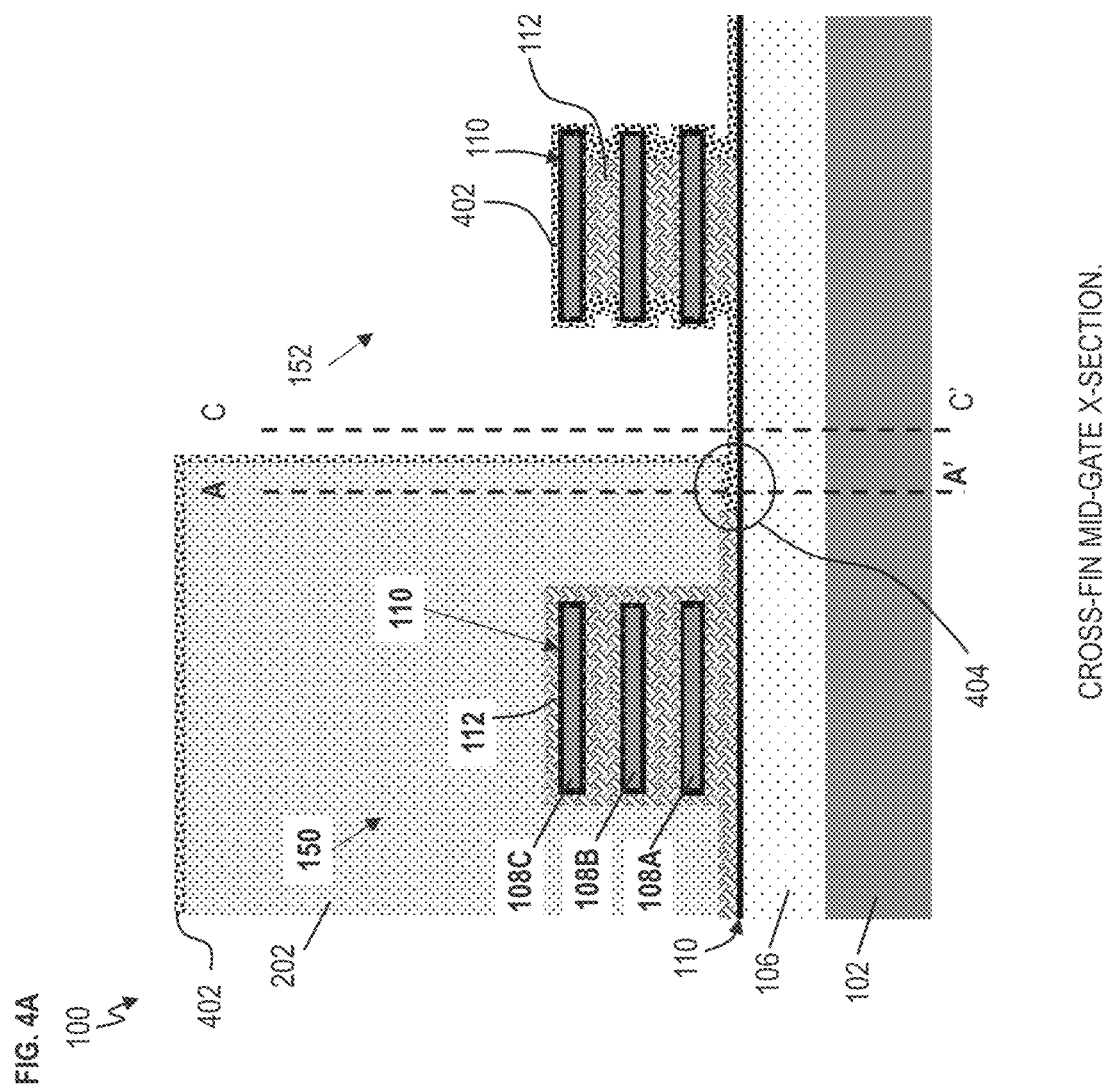

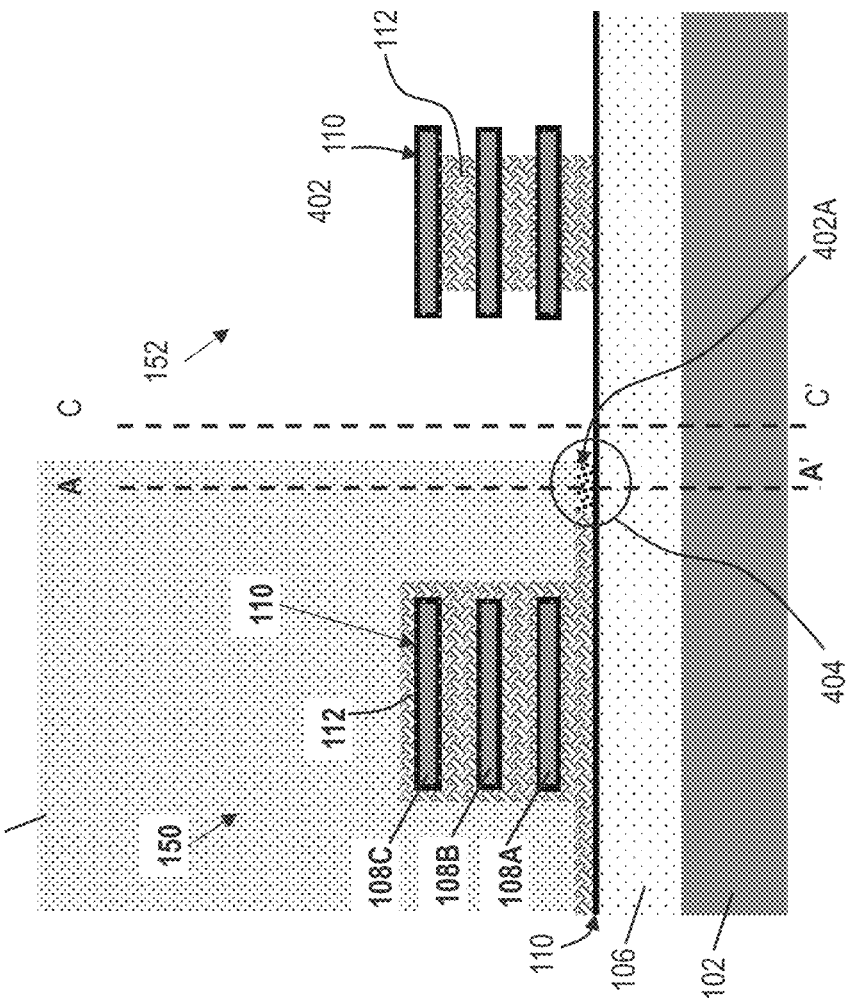

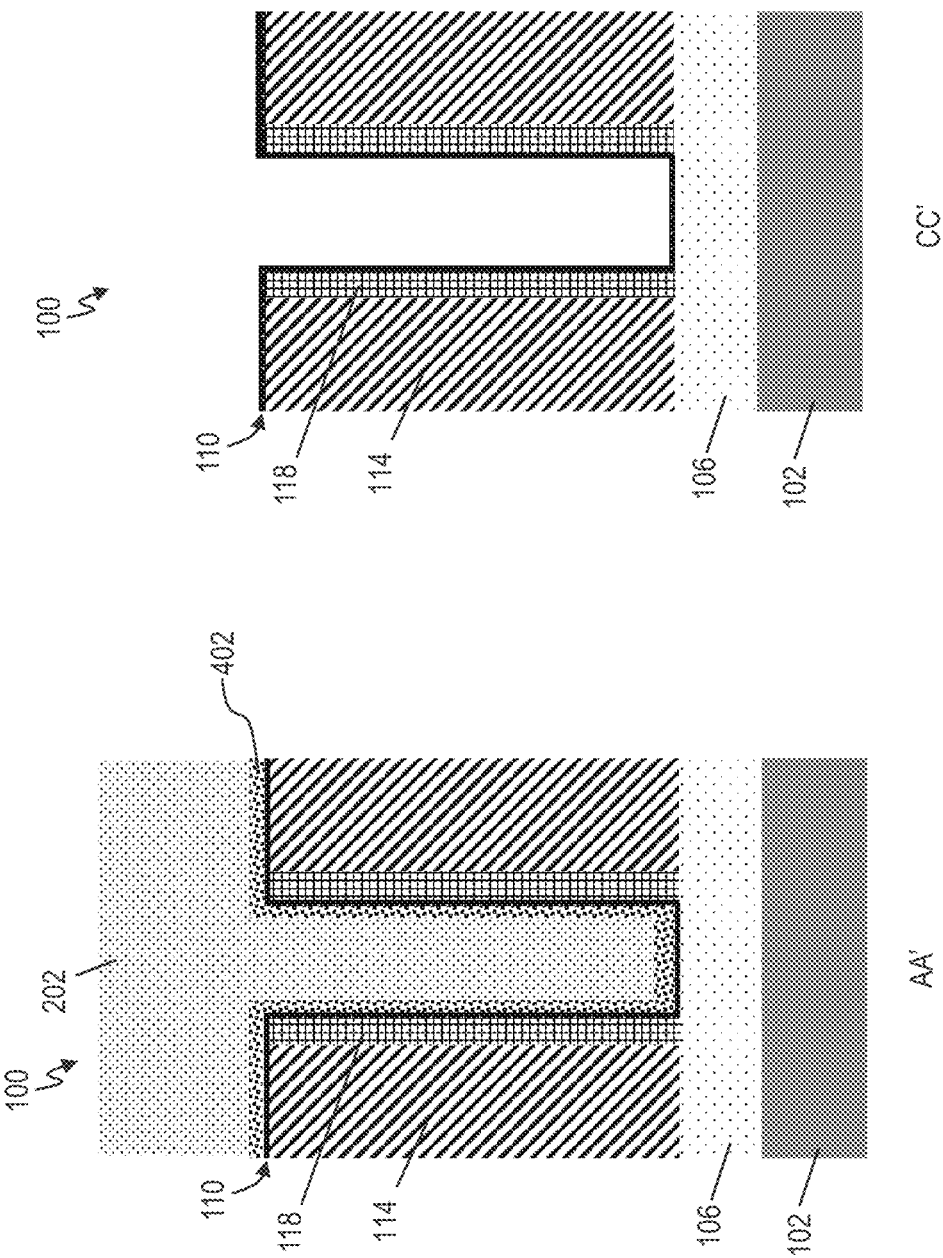

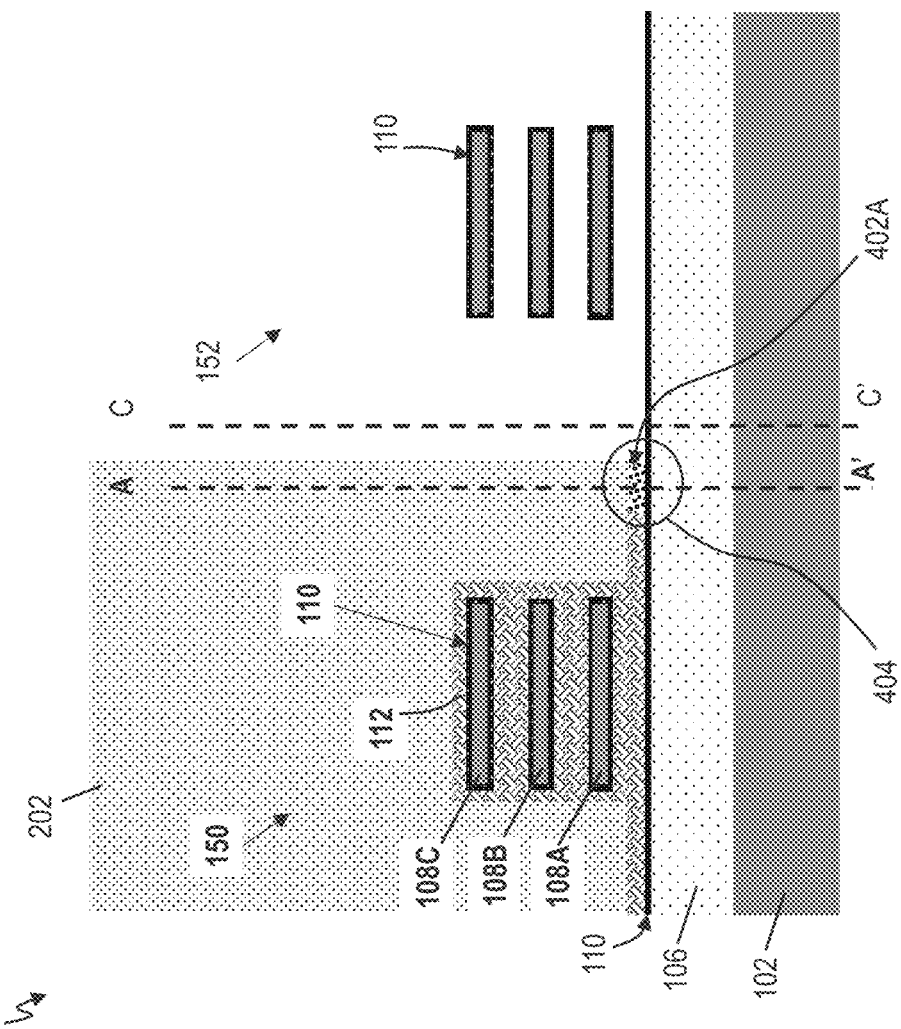

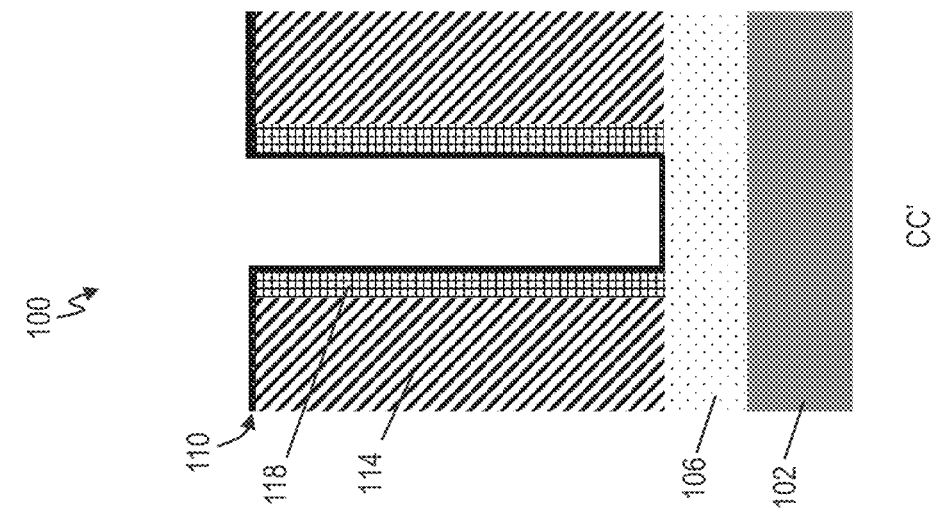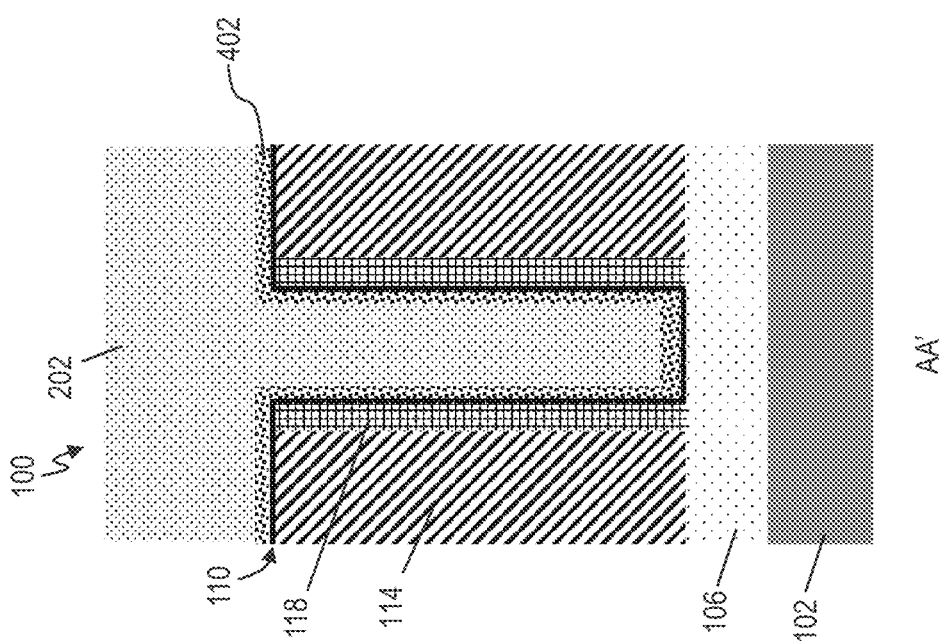

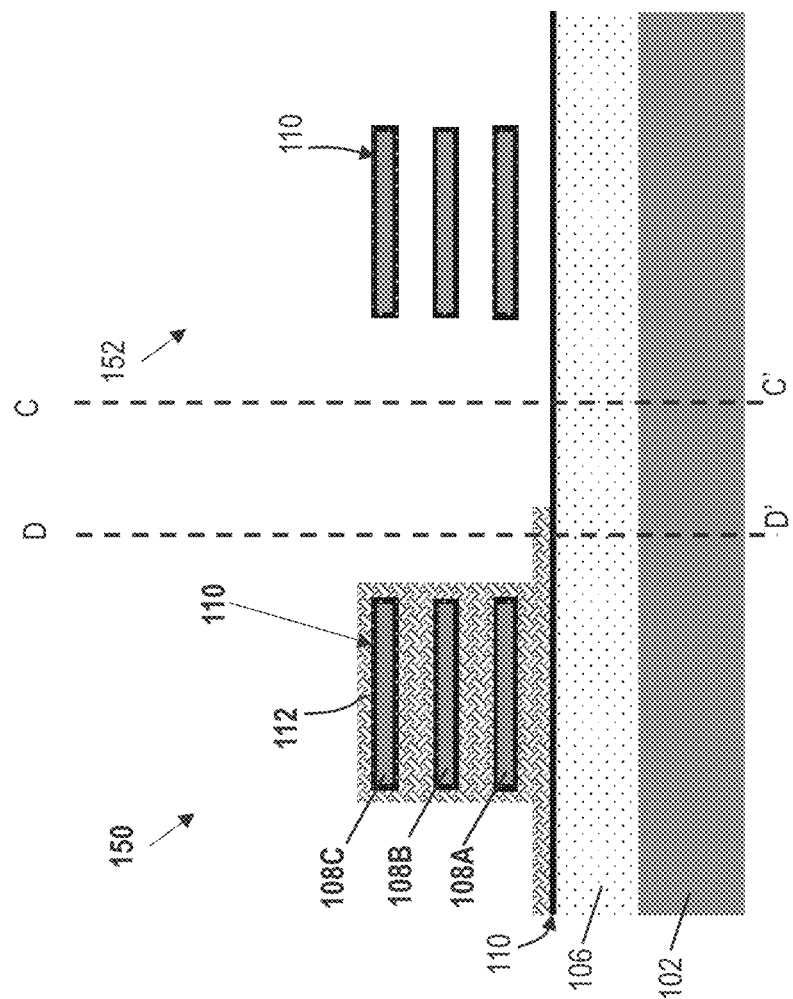

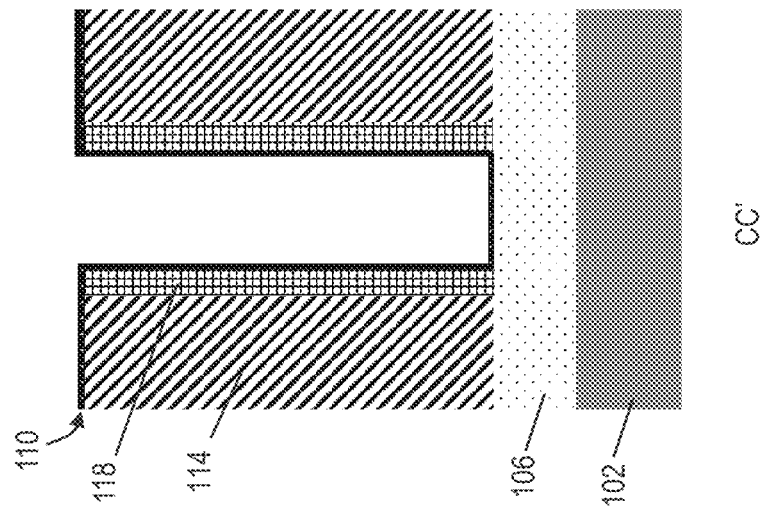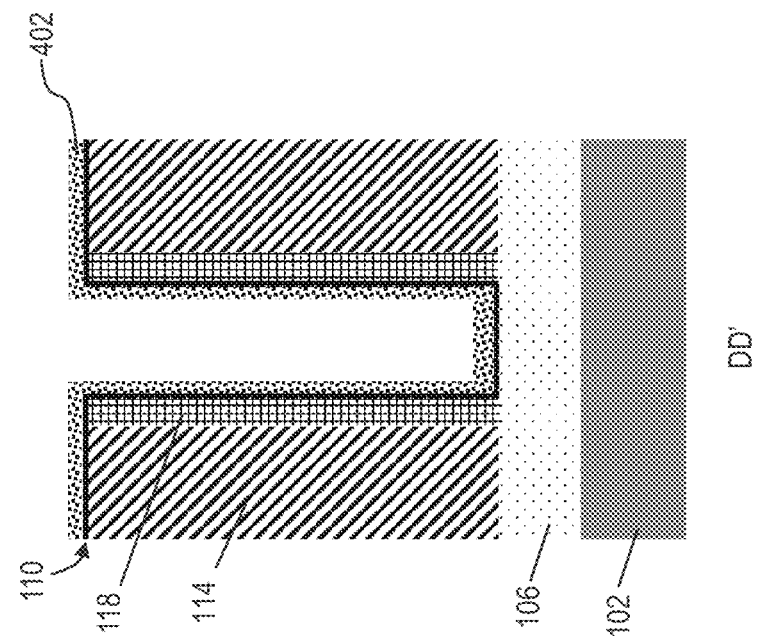

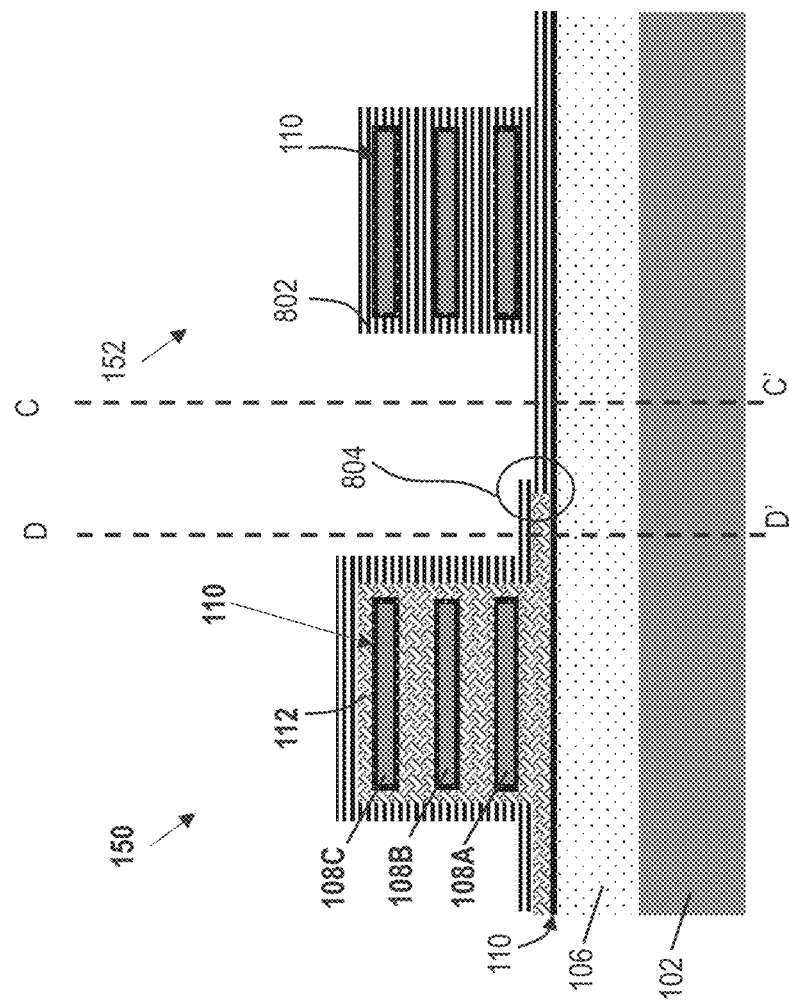

NANOSHEET DEVICES WITH DIFFERENT TYPES OF WORK FUNCTION METALS

DOMESTIC PRIORITY

This application is a divisional of U.S. patent application Ser. No. 15/938,522, filed Mar. 28, 2018, the disclosure of which is incorporated by reference herein in its entirety.

BACKGROUND

The present invention generally relates to fabrication methods and resulting structures for semiconductor devices, and more specifically, to forming nanosheet devices with different types of work function metals.

The MOSFET is a transistor used for amplifying or switching electronic signals. The MOSFET has a source, a drain, and a metal gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on").

N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

The nanowire or nanosheet MOSFET is a type of MOSFET that uses multiple stacked nanowires/nanosheets to form multiple channel regions. The gate regions of a nanosheet MOSFET are formed by wrapping gate stack materials around the multiple nanowire/nanosheet channels. This configuration is known as a gate-all-around (GAA) FET structure. The nanowire/nanosheet MOSFET device mitigates the effects of short channels and reduces drain-induced barrier lowering.

SUMMARY

Embodiments of the invention are directed to a semiconductor device. A non-limiting example of the semiconductor device includes a first stack having a first two or more nanowires, a first work function metal on the first two or more nanowires, and a second work function metal on the first work function metal, where the first two or more nanowires are separated by the first work function metal. The semiconductor device includes a second stack having a second two or more nanowires and the second work function metal, where the second two or more nanowires are separated by the second work function metal.

Embodiments of the invention are directed to a method for fabricating a semiconductor device. A non-limiting example of the method includes forming a first work function metal in a first stack and a second stack, the first stack and the second stack each having two or more nanowires separated by the first work function metal. The method includes forming a mask on the first stack such that the first work function metal in the first stack is protected while the first work function metal in the second stack is exposed, and undercutting the mask by removing a portion of the first work function metal in the first stack, such that a gap remains at a location where the portion is removed. Also, the method includes forming a plug in the gap underneath the mask at the location so as to protect the first work function metal in the first stack, and removing the first work function metal in the second stack, thereby removing the first work function metal from in between the two or more nanowires of the second stack. Further, the method includes removing the mask and the plug from the first stack, and forming a second work function metal on the first stack and the second stack.

Embodiments of the invention are directed to a method for fabricating a semiconductor device. A non-limiting example of the method includes providing a first stack and a second stack each having a first work function metal, where a mask covers the first stack and a plug is adjacent to both the mask and the first work function metal of the first stack. The method includes removing the first work function metal from the second stack, while the first work function metal of the first stack is protected by the mask and the plug. Also, the method includes removing the mask and the plug, and forming a second work function metal on the first stack and the second stack.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a cross-fin middle-gate cross-sectional view of a semiconductor device after fabrication operations according to embodiments of the invention;

FIG. 1B depicts a cross-sectional view of the semiconductor device shown in FIG. 1A taken along line A-A' according to embodiments of the invention;

FIG. 1C depicts a cross-sectional view of the semiconductor device shown in FIG. 1A taken along line B-B' according to embodiments of the invention;

FIG. 2A depicts a cross-fin middle-gate cross-sectional view of a semiconductor device after fabrication operations according to embodiments of the invention;

FIG. 3A depicts a cross-fin middle-gate cross-sectional view of a semiconductor device after fabrication operations according to embodiments of the invention;

FIG. 3B depicts a cross-sectional view of the semiconductor device shown in FIG. 3A taken along line A-A' according to embodiments of the invention;

FIG. 3C depicts a cross-sectional view of the semiconductor device shown in FIG. 3A taken along line C-C' according to embodiments of the invention;

FIG. 4A depicts a cross-fin middle-gate cross-sectional view of a semiconductor device after fabrication operations according to embodiments of the invention;

FIG. 5A depicts a cross-fin middle-gate cross-sectional view of a semiconductor device after fabrication operations according to embodiments of the invention;

FIG. 5B depicts a cross-sectional view of the semiconductor device shown in FIG. 5A taken along line A-A' according to embodiments of the invention;

FIG. 5C depicts a cross-sectional view of the semiconductor device shown in FIG. 5A taken along line C-C' according to embodiments of the invention;

FIG. 6A depicts a cross-fin middle-gate cross-sectional view of a semiconductor device after fabrication operations according to embodiments of the invention;

FIG. 6B depicts a cross-sectional view of the semiconductor device shown in FIG. 6A taken along line A-A' according to embodiments of the invention;

FIG. 6C depicts a cross-sectional view of the semiconductor device shown in FIG. 6A taken along line C-C' according to embodiments of the invention;

FIG. 7A depicts a cross-fin middle-gate cross-sectional view of a semiconductor device after fabrication operations according to embodiments of the invention;

FIG. 7B depicts a cross-sectional view of the semiconductor device shown in FIG. 7A taken along line D-D' according to embodiments of the invention;

FIG. 7C depicts a cross-sectional view of the semiconductor device shown in FIG. 7A taken along line C-C' according to embodiments of the invention;

FIG. 8A depicts a cross-fin middle-gate cross-sectional view of a semiconductor device after fabrication operations according to embodiments of the invention;

Figure 2C:
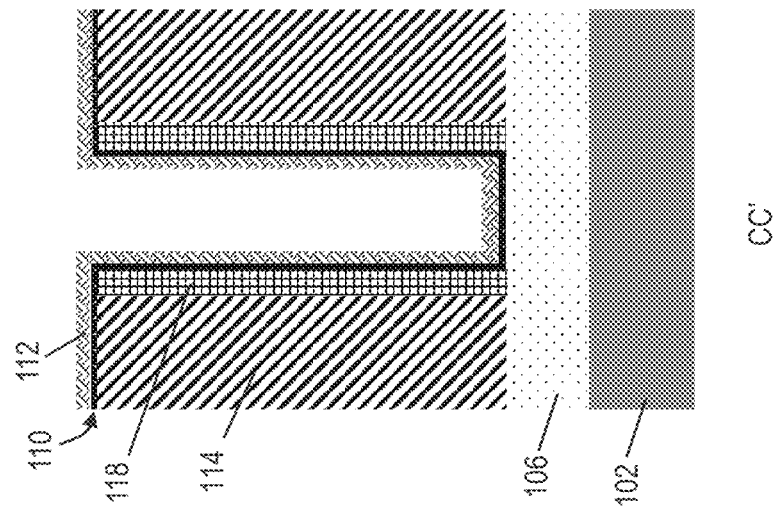
FIG. 2C depicts a cross-sectional view of the semiconductor device shown in FIG. 2A taken along line C-C' according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, gate-all-around (GAA) nanosheet FET structures can provide superior electrostatics. In contrast to known Fin-type FET (FinFET) structures in which the fin element of the transistor extends "up" out of the transistor, nanosheet FET designs implement the fin as a silicon nanosheet/nanowire. In a known configuration of a GAA nanosheet FET, a relatively small FET footprint is provided by forming the channel region as a series of nanosheets (i.e., silicon nanowires). A known GAA configuration includes a source region, a drain region, and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized.

A dual work function metal scheme is difficult to realize for nanosheet technology. A state-of-the-art method of forming dual work function metals is to protect the NFET (PFET) side by a mask layer (e.g., an organic planarization layer (OPL)) and then etch away the work function metal on the PFET (NFET) side. However, this method does not work for nanosheets due to work function metal pinch-off between sheets. Completely etching the work function metal in between nanosheets requires a long etch time during which the etch can undercut below the mask material and damage the work function metal on the protected device ((NFET) or PFET).

Turning now to an overview of the aspects of the invention, one or more embodiments of the invention address the above-described shortcomings of the prior art by providing a semiconductor device and a method of forming the semiconductor device in which a plug of liner is provided underneath the masking layer. The plug protects the first work function metal on one side (e.g., the NFET side) of the semiconductor device while the other side (e.g., the PFET side) is being processed. The first work function metal is removed from one side, and then the masking layer and plug are removed. The second work function metal can then be formed on both the NFET side and PFET side of the substrate/wafer.

Turning now to a more detailed description of aspects of the present invention, FIG. 1A depicts a cross-fin middle-gate cross-sectional view of a semiconductor device 100 according to embodiments of the invention. FIG. 1B depicts a cross-sectional view of the semiconductor device 100 taken along line A-A' of FIG. 1A according to embodiments of the invention. FIG. 1C depicts a cross-sectional view of the semiconductor device 100 taken along line B-B' of FIG. 1A according to embodiments of the invention. A replacement metal gate (RMG) process has been performed, as understood by one skilled in the art.

In FIG. 1A, the semiconductor device 100 has stacks 150 and 152, bottom isolation material 106 formed on a substrate 102, and nanowires/nanosheets 108A, 108B, and 108C. In each stack 150 and 152, the nanowires/nanosheets 108A, 108B, and 108C are separated by one or more high-k materials 110 and a first work function metal 112. The nanowires/nanosheets 108A, 108B, and 108C are wrapped in the high-k material 110. The nanowires/nanosheets 108A, 108B, and 108C can be referred to generally as nanowires/nanosheets. Although three nanowires/nanosheets 108A, 108B, and 108C are illustrated for explanation purposes, the stacks 150 and 152 can each have two or more nanowires/nanosheets, such as 3, 4, 5, 6, etc.

Example materials for the nanosheet/nanowire layers 108 can include silicon. The nanosheet layers 108 can be doped or undoped. When doped, the nanosheet/nanowire layers can include "P" type dopants such as boron, aluminum, gallium, and indium, or "N" type dopants such as phosphorus, arsenic, antimony. Other materials or combinations of materials can also be used. Other non-limiting examples of semiconductor materials for the nanosheet/nanowire layers 108 include strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. In some embodiments of the invention, the thickness of the nanosheet/nanowire layers 108 can be about 3 nm to about 20 nm thick. In some embodiments of the invention, the thickness of the nanosheet/nanowire layers 108 can be between about 10 nm to about 12 nm. Greater and smaller thicknesses are also contemplated.

The isolation material 106 can be, for example, an oxide material such as silicon dioxide ($SiO_2$). The high-k dielectric materials 110 can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The substrate 102 can encompasses semiconductor materials conventionally used in the semiconductor industry from which to make electrical devices. In embodiments of the invention, the starting substrate can be a semiconductor-on-insulator (SOI) substrate, which already includes the buried oxide layer. Alternatively, the starting substrate can be a bulk semiconductor including a sole semiconductor material or a combination of two or more semiconductor materials. The semiconductor material can include one or more monocrystalline silicon materials, such as the relatively pure or lightly impurity-doped monocrystalline silicon materials typically used in the semiconductor industry, as well as polycrystalline silicon materials, where silicon can be mixed with other elements such as carbon and the like. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. The semiconductor material also includes other materials such as relatively pure and impurity-doped gallium arsenide, germanium, gallium arsenide, gallium nitride, cadmium telluride, and zinc selenide, zinc oxide, glass, and the like. The substrate 102 can be a monocrystalline silicon material. The silicon substrate 102 can be a bulk silicon wafer or can be a thin layer of silicon disposed over an insulating layer (SOI) that, in turn, can be supported by a carrier wafer. The substrate 102 can be material consisting essentially of III-V compound semiconductors. Other suitable substrates can include II-VI compound.

The type of work function metal(s) depends on the type of transistor and can differ between the NFET and the NFET. Examples of the first work function metal 112 and the second work function metal 802 depicted in FIGS. 8A, 8B, and 8C can be include p-type work function metal materials and n-type work function metal materials. The first work function metal 112 can be one type and the second work function metal 802 can be another type. P-type work function materials include compositions such as ruthenium, palladium, platinum, cobalt, nickel, and conductive metal oxides, conductive nitrides such as TiN, conductive carbide such as TiC or TiAlC, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, conductive nitrides such as TiN, or any combination thereof.

FIG. 1B depicts an inter-layer dielectric (ILD) material 114 formed on the bottom isolation material 106 and a trench 116 having a gate spacer 118 on the sidewalls. The high-k material 110 is formed to line the ILD material 114, the gate spacer 118, and the bottom isolation material 106 at the bottom of the trench 116.

FIG. 1C depicts epitaxially grown source/drain regions 120A and 120B connected to opposite sides of the nanosheets 108 to form nanosheet channels in between. Inner spacers 122 separate the nanosheets 108 at the edges, while the high-k material 110 and first work function metal 112 separate the nanosheets in the middle.

The ILD material 114 can be, for example, an oxide. A suitable a low-k dielectric material can be utilized for the ILD material 114. The gate spacer 118 can be, for example, an oxide or nitride material. The inner spacers 122 can be, for example, an oxide or nitride material.

Standard lithographic processes can be utilized to form the initial structure in FIGS. 1A, 1B, and 1C as understood by one skilled in the art. An example process can include growing SiGe/Si multilayer materials (i.e., alternating sacrificial SiGe layers and Si nanosheet layers) on a SOI substrate, patterning the multilayer stack into fins, forming a dummy gate structure, forming a spacer (e.g., gate spacer 118) on the dummy gate sidewall, directionally etching to remove stack materials in the source/drain regions, forming inner spacers (e.g., as depicted in the B-B' cross-section of FIG. 1C, which can be done by first etching back the exposed sacrificial SiGe and then filling in with the inner spacer material), and growing the source/drain epitaxial layer. Further, the example process can include depositing ILD and performing chemical mechanical planarization/polishing, removing the dummy gate material, selectively removing the sacrificial SiGe to suspend the Si nanosheet channel, and then depositing the high-k material and the first work function metal.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Figure 2B:
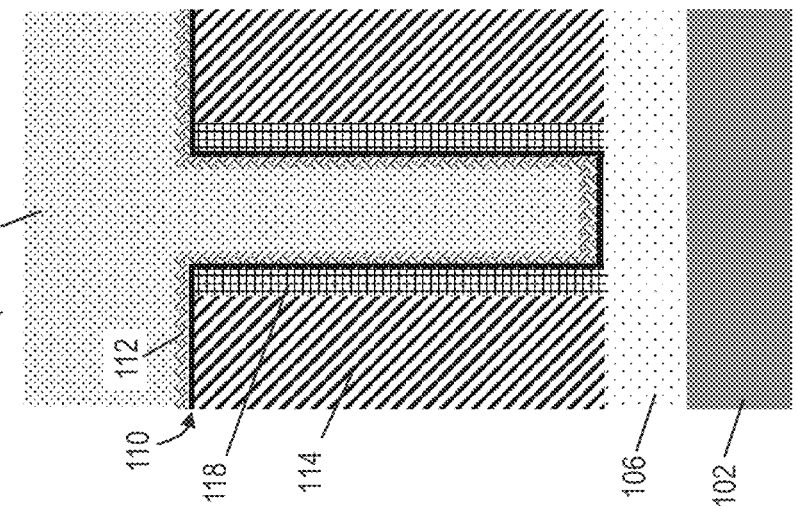
FIG. 2B depicts a cross-sectional view of the semiconductor device shown in FIG. 2A taken along line A-A' according to embodiments of the invention.

FIG. 2A depicts a cross-fin middle-gate cross-sectional view of the semiconductor device 100 according to embodiments of the invention. FIG. 2B depicts a cross-sectional view of a semiconductor device 100 taken along line A-A' of FIG. 2A according to embodiments of the invention. FIG. 2C depicts a cross-sectional view of the semiconductor device 100 taken along line C-C' of FIG. 2A according to embodiments of the invention. Deposition and patterning of masking material are performed using standard lithographic processes.

A masking material or mask 202 is deposited on top of the semiconductor device 100 such that the stacks 150 and 152 are covered. An example of the masking material 202 can be amorphous carbon. The masking material 202 is patterned to leave one stack 150 covered while uncovering the other stack 152 as depicted in FIG. 2A. The masking material 202 can be patterned using, for example, reactive ion etching (RIE). FIG. 2B depicts the masking material 202 covering first work function metal 112 while the first work function metal 112 is exposed in FIG. 2C.

FIG. 3A depicts a cross-fin middle-gate cross-sectional view of the semiconductor device 100 according to embodiments of the invention. FIG. 3B depicts a cross-sectional view of a semiconductor device 100 taken along line A-A' of FIG. 3A according to embodiments of the invention. FIG. 3C depicts a cross-sectional view of the semiconductor device 100 taken along line C-C' of FIG. 3A according to embodiments of the invention. An undercut is etched using standard lithograph processes.

An isotropic etch of the first work function metal 112 is performed to target the work function metal width, so that an intentional overetch occurs (during the isotropic etch) to create an undercut or gap 302 underneath the masking material 202. The undercut or gap 302 is formed by removing a portion of the first work function metal 112 from underneath the masking material 202 so as to leave a gap. The thickness or height (H) of the undercut/gap 302 corresponds to (i.e., matches) the thickness of the first work function metal 112 having been removed. The thickness or height (H) of the undercut/gap 302 can be, for example, 3 nm to 10 nm. The thickness or height (H) of the undercut/gap 302 measured from the bottom surface of the making material 202 to the top surface of the high-k material 110 underneath the masking material 202, where this high-k material 110 is depicted on top of the bottom isolation material 106 in FIG. 3A. High-k material 110 can be deposited by the so-called atomic layer deposition process which conformally coats material on every exposed surface. This undercut/gap 302 is intentionally formed in preparation for further processing, in accordance with embodiments of the invention.

The first work function metal 112 can be etched using, for example, an isotropic etch. During the isotropic etch, FIG. 3A shows that the first work function metal 112 has also been etched back on the side of the stack 152, for example, 5 nm. Between the nanosheets 108 in stack 152, the first work function metal 112 has been etched back such that edges of the nanosheets 108 extend or overhang over the missing area of the first work function metal 112 and such that spaces/areas 304 are formed at the recessed areas where the first work function metal 112 has been removed in FIG. 3A.

FIG. 3B depicts the undercut or gap 302 that runs underneath the masking material 202 after removal of a portion of the first work function metal 112 by the isotropic etch. The undercut or gap 302 separates the masking material 202 from the high-k material 110, with a separation distance or height (H) discussed in FIG. 3A. The view in FIG. 3C illustrates that the isotropic etch removes the first work function metal 112 such that the high-k material 110 is exposed.

Figure 4C:
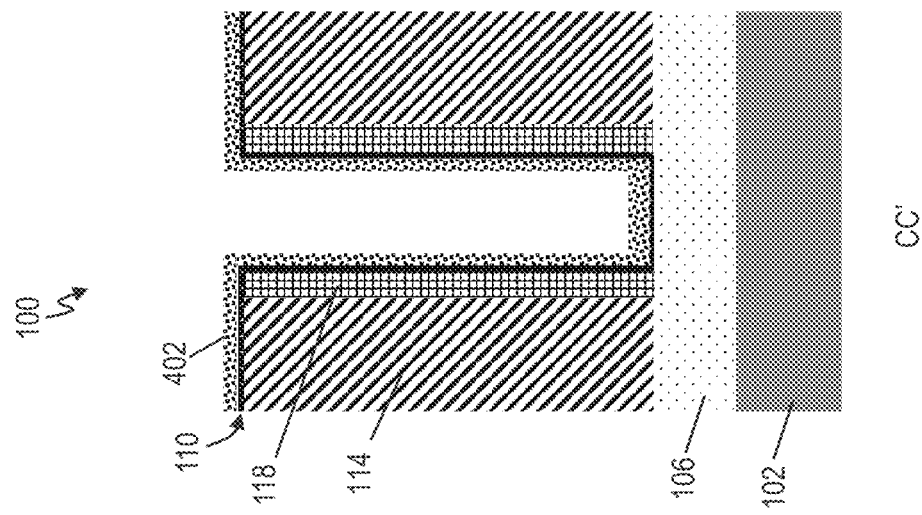
FIG. 4C depicts a cross-sectional view of the semiconductor device shown in FIG. 4A taken along line C-C' according to embodiments of the invention.
Figure 4B:
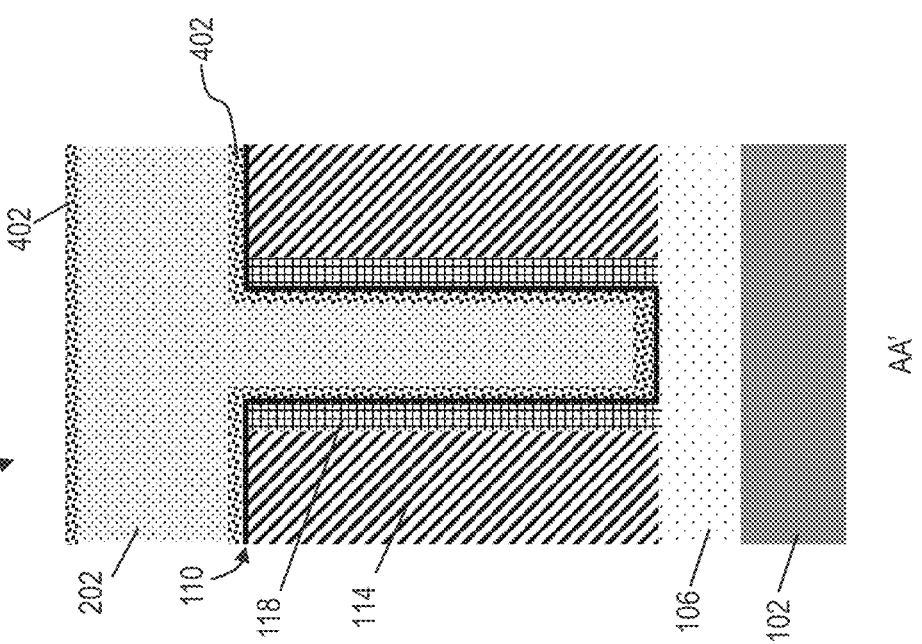
FIG. 4B depicts a cross-sectional view of the semiconductor device shown in FIG. 4A taken along line A-A' according to embodiments of the invention.

FIG. 4A depicts a cross-fin middle-gate cross-sectional view of the semiconductor device 100 according to embodiments of the invention. FIG. 4B depicts a cross-sectional view of the semiconductor device 100 taken along line A-A' of FIG. 4A according to embodiments of the invention. FIG. 4C depicts a cross-sectional view of the semiconductor device 100 taken along line C-C' of FIG. 4A according to embodiments of the invention. Pinch off is performed by liner deposition using standard lithographic processes.

A liner 402 is deposited to pinch off the undercut or gap 302 beneath the masking material 202 as depicted in FIGS. 4A, 4B, and 4C. In other words, the liner 402 completely fills in the undercut or gap 302 beneath the masking material 202 in a pinch off region in FIGS. 4A and 4B. The pinch off region 404 is highlighted by a circle in FIG. 4A, while the view in FIG. 4B is the pinch off region 404 that has been filled in by the liner 402. Between the nanosheets 108, the liner 402 is not pinched off (i.e., not completely filled) because of the larger gap between the nanosheets 108. The liner 402 can be a nitride, such as silicon nitride (SiN). Other example materials of the liner 402 can include SiCO, SiOCN, etc. A conformal deposition process is utilized to target the undercut or gap 302. For example, atomic layer deposition (ALD) can be used as a conformal deposition process among other types of conformal deposition processes.

FIGS. 4A and 4B illustrate the liner 402 filling in the previous undercut or gap 302 between the high-k material 110 and the masking material 202. Additionally, the liner 402 is on the top and sides of the masking material 202. On the side of the stack 152, FIGS. 4A and 4C illustrate the liner 402 covering the high-k material 110.

FIG. 5A depicts a cross-fin middle-gate cross-sectional view of the semiconductor device 100 according to embodiments of the invention. FIG. 5B depicts a cross-sectional view of the semiconductor device 100 along line A-A' of FIG. 5A according to embodiments of the invention. FIG. 5C depicts a cross-sectional view of the semiconductor device 100 along line C-C' of FIG. 5A according to embodiments of the invention. Removal of a portion of the liner 402 is performed using standard lithographic processes.

The liner 402 is etched back by conformal etching such that the pinch off region 404 remains to protect the left stack 150 from a subsequent etch to the first work function metal 112 as depicted in FIGS. 5A and 5B. The remaining liner 402 is or functions as a plug 402A at the end of the first work function metal 112 as seen underneath the masking material 202 in the pinch off region 404. The liner 402 is etched back to (substantially) align with the edge of the masking material 202 such that the first work function metal 112 is not exposed; this means that subsequent etching and fabrication processing does not reach or deteriorate the protected first work function metal 112 via any undercut or gap. In some implementations, the etched back liner 402 might not exactly align with the edge of the masking material 202 and a small overetch is acceptable.

The liner 402 is removed from the top and sides of the masking material and from the stack 152 on the right side of the semiconductor device 100, while the liner 402 (i.e., plug 402A) at the pinch off region 404 remains intact. Accordingly, the first work function metal 112 is exposed in the stack 152 on the right side of the semiconductor device 100 in FIG. 5A. FIG. 5B illustrates that the liner 402 remains beneath the masking material 202. FIG. 5C is a view illustrating areas not protected by the liner 402 has been removed.

FIG. 6A depicts a cross-fin middle-gate cross-sectional view of the semiconductor device 100 according to embodiments of the invention. FIG. 6B depicts a cross-sectional view of a semiconductor device 100 along line A-A' of FIG. 6A according to embodiments of the invention. FIG. 6C depicts a cross-sectional view of the semiconductor device 100 along line C-C' of FIG. 6A according to embodiments of the invention.

An aggressive etch is utilized to remove exposed first work function metal 112 between the nanosheets 108 as depicted in FIG. 6A. The exposed first work function metal 112 can be etched using, for example, an hydrofluoric acid (HF) based wet etchant. During the etch of the exposed first work function metal 112 in stack 152, the plug 402A of liner 402, remaining at the first work function metal end (i.e., at the pinch off region 404) underneath the masking material 202, is designed to prevent an undesired undercut as depicted in FIGS. 6A and 6B. This liner plug 402A protects the first work function metal 112 under the masking material 202 on the left side of the semiconductor device 100, which concurrently protects the stack 150. Although the right stack 152 of nanosheets 108 encompassed by the high-k material 110 appears to be floating in air, it is noted that FIG. 1C shows that the source/drain regions 120A and 120B and inner spacers 122 are actually holding the nanosheets 108 in the right stack 152 in place, as understood by one skilled in the art. The view in FIG. 6C has no first work function metal to remove.

FIG. 7A depicts a cross-fin middle-gate cross-sectional view of the semiconductor device 100 according to embodiments of the invention. FIG. 7B depicts a cross-sectional view of a semiconductor device 100 along line A-A' of FIG. 7A according to embodiments of the invention. FIG. 7C depicts a cross-sectional view of the semiconductor device 100 along line C-C' of FIG. 7A according to embodiments of the invention.

The masking material 202 and remaining liner 402 (i.e., the liner plug 402A) at the end of the first work function metal 112 are removed. As can be seen in FIGS. 7A and 7B, the masking material 202 no longer covers the first work function metal 112. The right side (including the right stack 152) of the semiconductor device 100 has no first work function metal 112 as depicted in FIGS. 7A and 7C. Both the left stack 150 and right stack 152 are ready for deposition of a second work function metal discussed below.

Figure 8B:
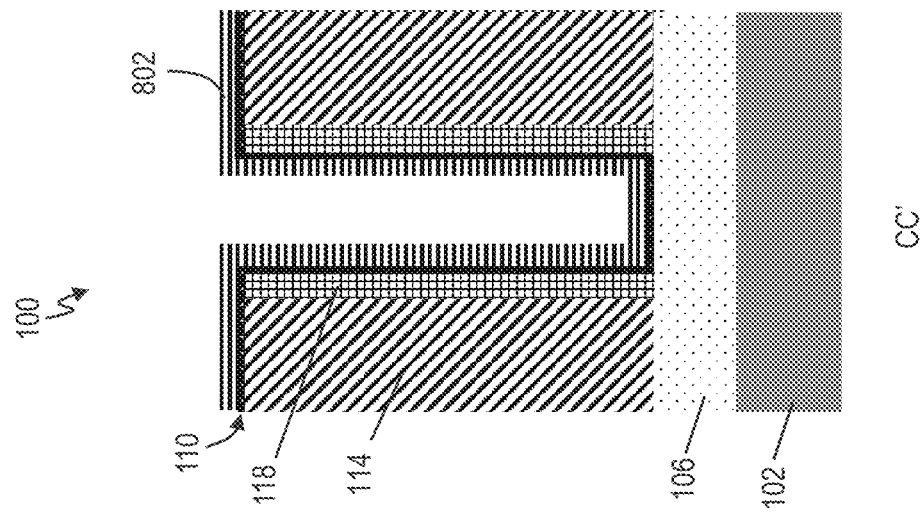
FIG. 8B depicts a cross-sectional view of the semiconductor device shown in FIG. 8A taken along line D-D' according to embodiments of the invention.
Figure 8C:
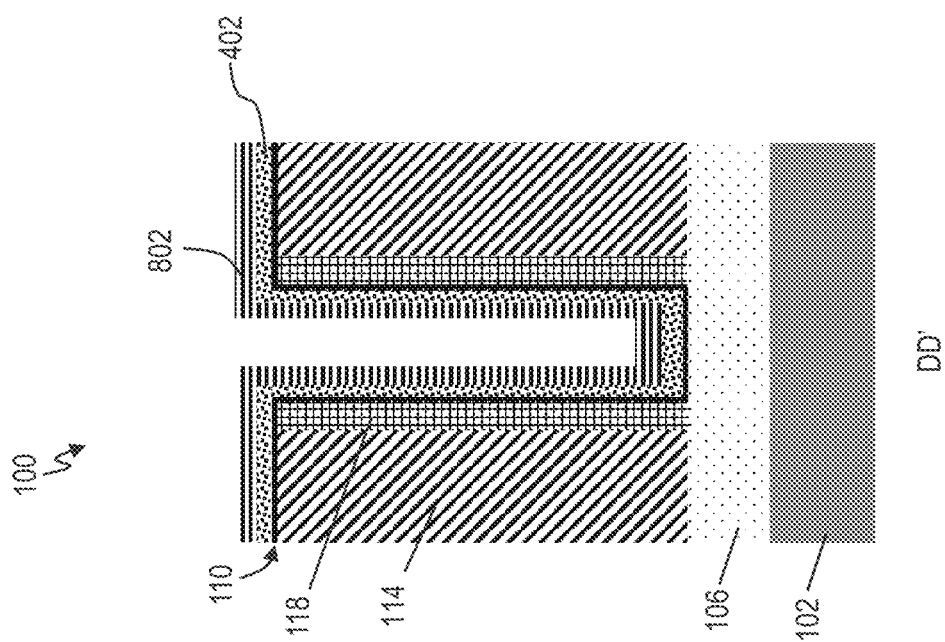
FIG. 8C depicts a cross-sectional view of the semiconductor device shown in FIG. 8A taken along line C-C' according to embodiments of the invention.

FIG. 8A depicts a cross-fin middle-gate cross-sectional view of the semiconductor device 100 according to embodiments of the invention. FIG. 8B depicts a cross-sectional view of a semiconductor device 100 along line A-A' of FIG. 8A according to embodiments of the invention. FIG. 8C depicts a cross-sectional view of the semiconductor device 100 along line C-C' of FIG. 8A according to embodiments of the invention.

FIGS. 8A, 8B, and 8C illustrate deposition of a second work function metal 802 on the semiconductor device 100. On the left side of FIG. 8A, the left stack 150 includes the second work function 802 formed directly on top of the first work function metal 112, while the first work function metal 112 is formed directly on the high-k material 110 surrounding the nanosheets 108. A step 804 is formed at the previous location of the pinch off 404.

On the right side of FIG. 8A, the right stack 152 includes the second work function 802 formed directly on the high-k material 110 surrounding the nanosheets 108.

For the left stack 150, its gate stack includes the high-k dielectric material 110, the first work function metal 112, and the second work function metal 802, where the first and second work function metals are different. For the right stack 152, its gate stack includes the high-k dielectric material 110 and the second work function metal 802.

Contacts (not shown) can be formed to provide electrical access to the gate stacks and the source/drain regions 120A and 120B for operation of the transistor, as understood by one skilled in the art.

According to embodiments of the invention, a method of fabricating a semiconductor device 100 is provided. The method includes forming a first work function metal 112 in a first stack 150 and a second stack 152, the first stack and the second stack each having two or more nanosheets 108 (e.g., nanowires 108A, 108B, 108C) separated by the first work function metal 112. The method includes forming a mask 202 on the first stack 150 such that the first work function metal 112 in the first stack 150 is protected while the first work function metal 112 in the second stack 152 is exposed (i.e., not protected by the mask 202). The method includes undercutting the mask 202 by removing a portion of the first work function metal 112 in the first stack 150, such that a gap 302 remains at a location where the portion is removed and forming a plug 402A in the gap 302 underneath the mask 202 at the location so as to protect the first work function metal in the first stack 150. The method includes removing the first work function metal in the second stack 152, thereby removing the first work function metal 112 from in between the two or more nanowires 108 of the second stack 152. The method includes removing the mask 202 and plug 402A from the first stack 150 and forming a second work function metal 802 on the first stack 150 and the second stack 152.

The second work function metal 802 is formed on top of the first work function metal 112 in the first stack 150. No second work function metal is formed in between the two or more nanowires 108 of the first stack 150. Forming the second work function metal 802 on the first stack 150 and the second stack 152 causes the second stack 152 to have the two or more nanowires 108 separated by the second work function metal 802.

Undercutting the mask 202 by removing the portion of the first work function metal 112 in the first stack 150 includes etching the first work function metal 112 which removes the portion thereby creating an undercut below the mask 202 on the first stack 150. Etching the first work function metal 112 creates recessed areas in the first work function metal 112 in the second stack 150 as depicted in FIG. 5A. The two or more nanowires 108 overhang the recessed areas of the first work function metal 112 in the second stack 150 as depicted in FIG. 5A.

Forming the plug 402A in the gap 302 underneath the mask 202 at the location so as to protect the first work function metal 112 in the first stack includes depositing a liner 402 such that the liner pinches off in the gap 302 as depicted in FIGS. 4A, 4B, 4C. The liner 402 is removed except for in the gap 302, such that the liner 402 remaining in the gap forms the plug 402A. The liner covers the mask 202. The liner 402 covers the second stack 152. The plug 402A is at an end of the first work function metal 112 in the first stack 150. The plug 402A is formed of a nitride material.

According to embodiments of the invention, a method of fabricating a semiconductor device 100 is provided. The method includes providing a first stack 150 and a second stack 152 each having a first work function metal 112, where a mask 202 covers the first stack 150 and a plug 402A is adjacent to both the mask 202 and the first work function metal 112 of the first stack 150. The method includes removing the first work function metal 112 from the second stack 152, while the first work function metal 112 of the first stack 150 is protected by the mask 202 and the plug 402A. The method includes removing the mask 202 and the plug 402A and forming a second work function metal 802 on the first stack 150 and the second stack 152.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a first stack comprising a first two or more nanowires, a first work function metal on the first two or more nanowires, and a second work function metal in direct contact with and on the first work function metal, wherein the first two or more nanowires are separated by the first work function metal; and
   a second stack comprising a second two or more nanowires and the second work function metal, wherein the second two or more nanowires are separated by the second work function metal.

2. The semiconductor device of claim 1, wherein the second work function metal is formed on top of the first work function metal in the first stack.

3. The semiconductor device of claim 1, wherein the second work function metal is not formed in between the first two or more nanowires in the first stack.

4. The semiconductor device of claim 1, wherein a dielectric material is formed around the first two or more nanowires.

5. The semiconductor device of claim 4, wherein the dielectric material comprises a dielectric constant greater than 4.0.

6. The semiconductor device of claim 4, wherein the dielectric material comprises a dielectric constant greater than 7.0.

7. The semiconductor device of claim 4, wherein the dielectric material comprises a dielectric constant greater than 10.0.

8. The semiconductor device of claim 1, wherein a dielectric material is sandwiched between the first work function metal and the first two or more nanowires.

9. The semiconductor device of claim 1, wherein a dielectric material is formed around the second two or more nanowires.

10. The semiconductor device of claim 9, wherein the dielectric material comprises a dielectric constant greater than 4.0.

11. The semiconductor device of claim 9, wherein the dielectric material comprises a dielectric constant greater than 7.0.

12. The semiconductor device of claim 9, wherein the dielectric material comprises a dielectric constant greater than 10.0.

13. The semiconductor device of claim 1, wherein a dielectric material is sandwiched between the first work function metal and the second two or more nanowires.

14. The semiconductor device of claim 1, wherein the first work function metal and the second work function metal are different.

15. The semiconductor device of claim 1, wherein the first work function metal comprises a p-type work function metal and the second work function metal comprises an n-type work function metal.

16. The semiconductor device of claim 1, wherein the first work function metal comprises an n-type work function metal and the second work function metal comprises a p-type work function metal.

17. The semiconductor device of claim 1, wherein a step is between the first stack and the second stack.

18. The semiconductor device of claim 17, wherein the step is formed by the second work function metal in the first stack overlapping the second work function metal in the second stack.

19. The semiconductor device of claim 1, wherein the first stack and the second stack are formed on a substrate.

20. The semiconductor device of claim 19, wherein isolation material separates the first stack and the second stack from the substrate.

* * * * *